(12) United States Patent
Tanaka et al.

(10) Patent No.: US 10,991,898 B2
(45) Date of Patent: Apr. 27, 2021

(54) FLEXIBLE DISPLAY, METHOD FOR MANUFACTURING SAME, AND SUPPORT SUBSTRATE FOR FLEXIBLE DISPLAY

(71) Applicant: SAKAI DISPLAY PRODUCTS CORPORATION, Sakai (JP)

(72) Inventors: Kohichi Tanaka, Sakai (JP); Katsuhiko Kishimoto, Sakai (JP)

(73) Assignee: SAKAI DISPLAY PRODUCTS CORPORATION, Sakai (JP)

(*) Notice: Subject to any disclaimer, the term of this patent is extended or adjusted under 35 U.S.C. 154(b) by 0 days.

(21) Appl. No.: 16/607,339

(22) PCT Filed: Sep. 13, 2017

(86) PCT No.: PCT/JP2017/033087
§ 371 (c)(1),
(2) Date: Jan. 3, 2020

(87) PCT Pub. No.: WO2019/053819
PCT Pub. Date: Mar. 21, 2019

(65) Prior Publication Data
US 2020/0381635 A1    Dec. 3, 2020

(51) Int. Cl.
*H01L 51/52* (2006.01)
*H01L 51/56* (2006.01)
*H01L 51/00* (2006.01)

(52) U.S. Cl.
CPC ...... *H01L 51/0097* (2013.01); *H01L 51/5253* (2013.01); *H01L 51/56* (2013.01)

(58) Field of Classification Search
None
See application file for complete search history.

(56) References Cited

U.S. PATENT DOCUMENTS

| | | | |
|---|---|---|---|
| 6,794,320 B1* | 9/2004 | Parkhill | C03C 14/004 501/17 |
| 9,127,550 B2 | 9/2015 | Hunt et al. | |
| 2002/0074601 A1* | 6/2002 | Fox | H01L 28/56 257/350 |
| 2010/0182306 A1 | 7/2010 | Kimura et al. | |
| 2012/0327345 A1 | 12/2012 | Inoue et al. | |
| 2015/0221709 A1* | 8/2015 | Shimamura | H01L 27/3244 438/4 |
| 2016/0046823 A1 | 2/2016 | Barrera et al. | |
| 2016/0164013 A1 | 6/2016 | Lee | |
| 2016/0165735 A1* | 6/2016 | Akasaka | H05K 3/0044 451/41 |
| 2018/0024388 A1 | 1/2018 | Shingai et al. | |

FOREIGN PATENT DOCUMENTS

| JP | S62-050956 B2 | 10/1987 |
|---|---|---|
| JP | H02-258985 A | 10/1990 |
| JP | 2007-003859 A | 1/2007 |

(Continued)

*Primary Examiner* — Xiaoming Liu
(74) *Attorney, Agent, or Firm* — ScienBiziP, P.C.

(57) ABSTRACT

A flexible display supporting substrate of the present disclosure includes: a glass base (11); a plastic film (12) which has a surface (12s), the surface having a polish recess (12c), the plastic film being supported by the glass base (11); and an oxide layer (20) overlying a part of the surface (12s) of the plastic film (12) and covering at least part of the polish recess (12c).

4 Claims, 12 Drawing Sheets

(56) References Cited

FOREIGN PATENT DOCUMENTS

| | | |
|---|---|---|
| JP | 2008-213049 A | 9/2008 |
| JP | 4310784 B2 | 8/2009 |
| JP | 4310788 B2 | 8/2009 |
| JP | 4348217 B2 | 10/2009 |
| JP | 5007880 B2 | 8/2012 |
| JP | 2014-048619 A | 3/2014 |
| JP | 2016-181685 A | 10/2016 |
| JP | 2016-184533 A | 10/2016 |
| JP | 2016-537793 A | 12/2016 |
| WO | 2011/111273 A1 | 9/2011 |
| WO | 2013/190841 A1 | 12/2013 |
| WO | 2015/008586 A1 | 1/2015 |

\* cited by examiner

LASER BEAM

FLEXIBLE DISPLAY, METHOD FOR MANUFACTURING SAME, AND SUPPORT SUBSTRATE FOR FLEXIBLE DISPLAY

TECHNICAL FIELD

The present disclosure relates to a flexible display, a production method of the flexible display, and a flexible display supporting substrate.

BACKGROUND ART

A typical example of the flexible display includes a film which is made of a synthetic resin such as polyimide (hereinafter, referred to as "plastic film"), and elements supported by the plastic film, such as TFTs (Thin Film Transistors) and OLEDs (Organic Light Emitting Diodes). The plastic film functions as a flexible substrate. The flexible display is encapsulated with a gas barrier film (encapsulation film) because an organic semiconductor layer and an electrode layer which are constituents of the OLED are likely to deteriorate due to water vapor.

Production of the above-described flexible display is carried out using a glass base on which a plastic film is formed over the upper surface (flexible display supporting substrate). The glass base functions as a support for keeping the shape of the plastic film flat during the production process. Elements such as TFTs and OLEDs, a gas barrier film, and the other constituents are formed on the plastic film, whereby the structure of a flexible device is realized while it is supported by the glass base. Thereafter, the flexible device is separated from the glass base and gains flexibility. The entirety of a portion in which elements such as TFTs and OLEDs are arrayed is also referred to as "functional layer".

A foreign substance such as particles (hereinafter, also referred to as "contamination") is likely to adhere to the surface of a plastic film supported by a glass base. The contamination can deteriorate the device characteristics and the gas barrier film. A particle whose diameter is greater than, for example, 0.5 µm (typically, a particle which has a height of 1 µm to 5 µm) can be a cause of defects in TFTs, a cause of short-circuit or breakage of wires in the functional layer, or a cause of formation of a leak path for water vapor in the gas barrier film.

Patent Document No. 1 discloses a minute protrusion polishing apparatus for polishing away minute protruding portions on a flat plate by bringing a polishing tape into contact with the minute protruding portions. When such a protrusion polishing apparatus is used, particles can be removed by polishing.

Patent Document No. 2 discloses the technique of applying a mixture prepared by dissolving an insulative material in a solvent from the tip of a needle to defective portions such as a foreign substance on a pixel electrode and raised and recessed portions so as to cover these defective portions. The mixture is in the form of a liquid when it is applied. By subsequent heating, the mixture changes into a solidified insulating film. The insulating film that covers the defective portions suppresses occurrence of an abnormal electric current which is attributed to the defective portions.

CITATION LIST

Patent Literature

Patent Document No. 1: Japanese Laid-Open Patent Publication No. 2008-213049
Patent Document No. 2: WO 2013/190841

SUMMARY OF INVENTION

Technical Problem

By detecting a particle on the substrate and selectively polishing the particle using a polishing apparatus such as disclosed in Patent Document No. 1, the smoothness of the substrate surface is improved. However, according to research by the present inventors, it was found that if a gas barrier film and devices such as TFTs and OLEDs are formed on such a substrate, there is a probability that sufficient encapsulation performance (moisture resistance) cannot be realized.

According to the technique disclosed in Patent Document No. 2, the insulation of the defective portions improves, but the height of raised portions such as particles is not reduced and, therefore, the smoothness of the surface is not sufficiently improved. Thus, it is estimated that if the technique disclosed in Patent Document No. 2 is applied to production of a flexible display, the encapsulation performance deteriorates due to raised portions such as particles.

The present disclosure provides a flexible display, a production method of the flexible display, and a flexible display supporting substrate, which can solve the above-described problems.

Solution to Problem

A flexible display of the present disclosure includes, in an exemplary embodiment, a flexible substrate; and an OLED device supported by the flexible substrate. The flexible substrate includes a plastic film which has a surface, the surface having a polish recess, and an oxide layer overlying a part of the surface of the plastic film and covering at least part of the polish recess.

In one embodiment, the polish recess includes a plurality of polish scars.

In one embodiment, the oxide layer is a sintered layer.

In one embodiment, the oxide layer has an upper surface flatter than the polish recess in the surface of the plastic film.

In one embodiment, the flexible display includes: a first gas barrier film covering the surface of the plastic film and the oxide layer and located between the OLED device and the flexible substrate; and a second gas barrier film supported by the flexible substrate and covering the OLED device.

A flexible display supporting substrate of the present disclosure includes, in an exemplary embodiment, a glass base; a plastic film which has a surface, the surface having a polish recess, the plastic film being supported by the glass base; and an oxide layer overlying a part of the surface of the plastic film and covering at least part of the polish recess.

In one embodiment, the polish recess includes a plurality of polish scars.

In one embodiment, the oxide layer is a sintered layer.

In one embodiment, the oxide layer has an upper surface flatter than the polish recess in the surface of the plastic film.

In one embodiment, the flexible display supporting substrate includes a gas barrier film covering the surface of the plastic film and the oxide layer.

A flexible display production method of the present disclosure includes, in an exemplary embodiment, includes: providing a flexible display supporting substrate which includes a glass base and a plastic film on the glass base; polishing a part of the surface of the plastic film, thereby forming a polish recess in the surface; and forming a sintered layer so as to cover at least part of the polish recess in the surface of the plastic film.

In one embodiment, forming the sintered layer includes supplying a liquid material to the polish recess formed in the surface of the plastic film, and forming the sintered layer from the liquid material by heating the liquid material.

In one embodiment, the liquid material is a sol which contains an alkoxide.

In one embodiment, forming the sintered layer includes heating the liquid material to 350° C. or higher.

In one embodiment, the method includes forming a first gas barrier film so as to cover the surface of the plastic film, forming an OLED device so as to be supported by the flexible substrate, and forming a second gas barrier film so as to be supported by the flexible substrate and so as to cover the OLED device.

Advantageous Effects of Invention

According to an embodiment of the present invention, deterioration of the encapsulation performance of a flexible display which is attributed to minute structures over the substrate surface before formation of a gas barrier film can be suppressed.

DESCRIPTION OF EMBODIMENTS

Figure 1:
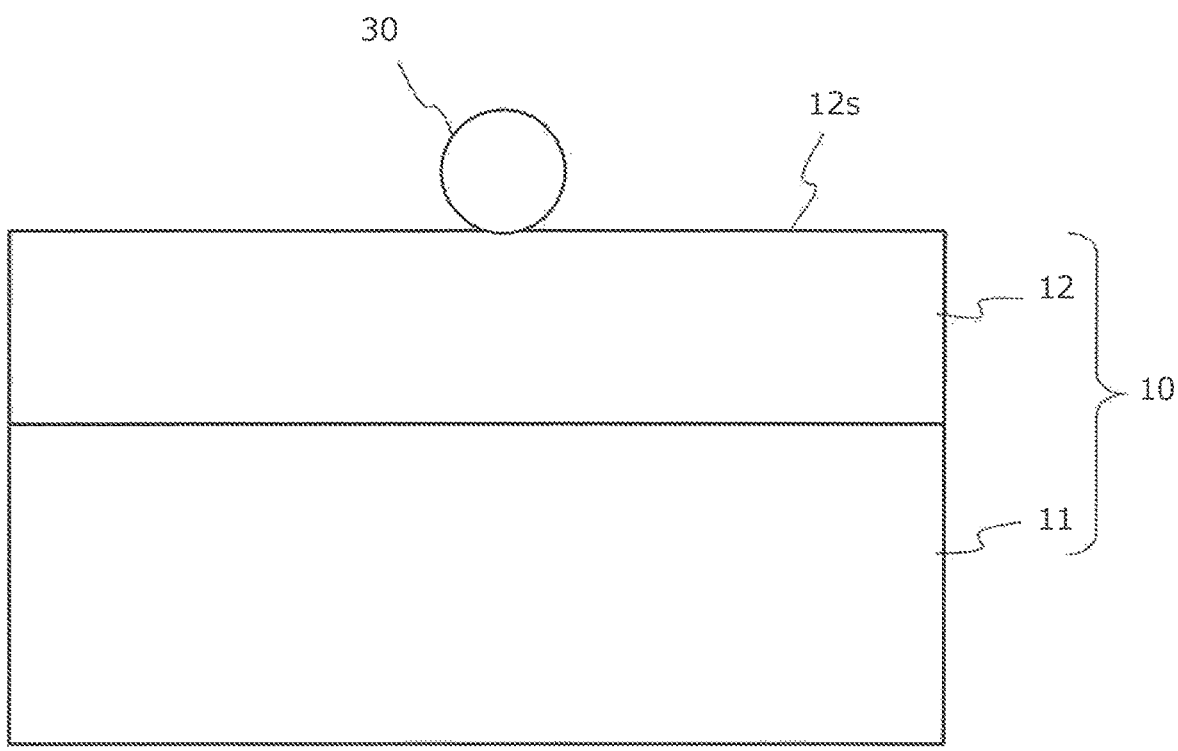
FIG. 1 is a diagram showing a cross section of a part of a typical example of a flexible display supporting substrate.

FIG. 1 is a diagram showing a cross section of a part of a typical example of a flexible display supporting substrate 10 (hereinafter, simply referred to as "supporting substrate"). The supporting substrate 10 of FIG. 1 includes a glass base 11 and a plastic film 12 provided on the glass base 11. Usually, the glass base is referred to as "glass substrate". In this example, the plastic film 12 is a polyimide film.

A surface 12s of the plastic film 12 of the supporting substrate 10 can have an unnecessary raised portion and/or contamination. The raised portion is a part of the plastic film 12. The contamination is a foreign substance adhered to the plastic film 12. A typical example of the contamination is a foreign substance called "particle". The particle can be made of various materials (organic and/or inorganic materials). In FIG. 1, for the sake of simplicity, a single particle 30 adhered to the surface 12s of the plastic film 12 is schematically illustrated. Many of the particles 30 derive from a substance once adhered to a thin film deposition unit, a transporting unit, or the like, or a substance floating in the air. Alternatively, the particle 30 can derive from a substance cut out from the supporting substrate 10 during transportation of the supporting substrate 10. In some cases, some of such particles 30 strongly adhere to the plastic film 12 and are not removed from the surface 12s of the plastic film 12 by a washing step. Also, the contamination such as the particle 30 can adhere to the surface 12s of the plastic film 12 after the washing step.

In the present application, raised portions and contamination, typically particles, are also generically referred to as "polish removal object (target)".

Although a single particle 30 is shown in FIG. 1, the number of polish removal objects on a single supporting substrate 10 is not limited to this example. For example, several to one hundred particles per unit area (1 m$^2$) can adhere to the surface 12s of the plastic film 12 of the supporting substrate 10. The size (diameter or height) of each particle can be, for example, 1-5 µm. The diameter or height of the particle 30 can be, for example, several micrometers.

Although the shown particle 30 is spherical, actual particles 30 can have various shapes. If the diameter or height of the particle 30 is, for example, greater than 0.5 µm, there is a probability that the characteristics of a device supported by the supporting substrate 10 and the gas barrier film will deteriorate. Therefore, removing the particle 30 before formation of the device and the gas barrier film is preferred. In general, the particle 30 is an example of an irregular structure which can be detected by external observation. Removal of the particle 30 can be realized by a local polishing process with the use of a known polishing apparatus.

Figure 2A:
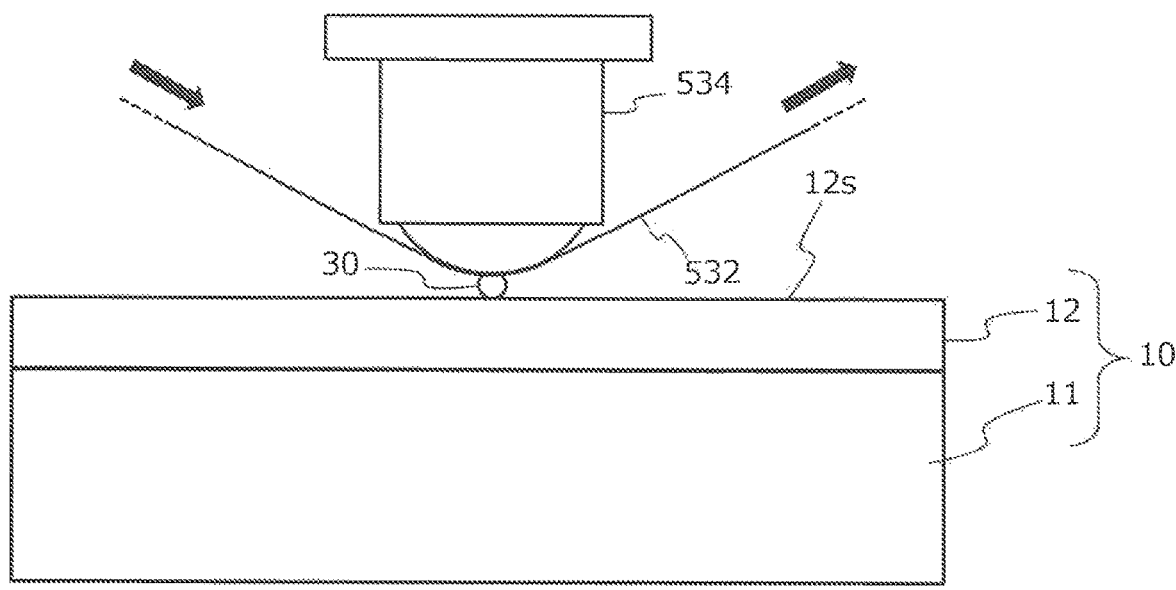
FIG. 2A is a diagram showing a part of the step of polishing away a particle by pressing a running polishing tape against the particle.

The outline of a polishing process carried out by a polishing apparatus and problems found by the present inventors are described with reference to FIG. 2A and FIG. 2B. In this example, the polishing apparatus includes a pressure application unit 534 for pressing a running polishing tape 532 against the particle 30 as shown in FIG. 2A. The polishing tape 532 has abrasive grains adhered to its surface. The abrasive grains can be made of powdery particles of a high-hardness material such as, for example, diamond, silicon carbide, alumina materials. The polishing tape 532 is wound around a roller which is rotated by a motor and can reciprocate in two different directions.

Figure 2B:
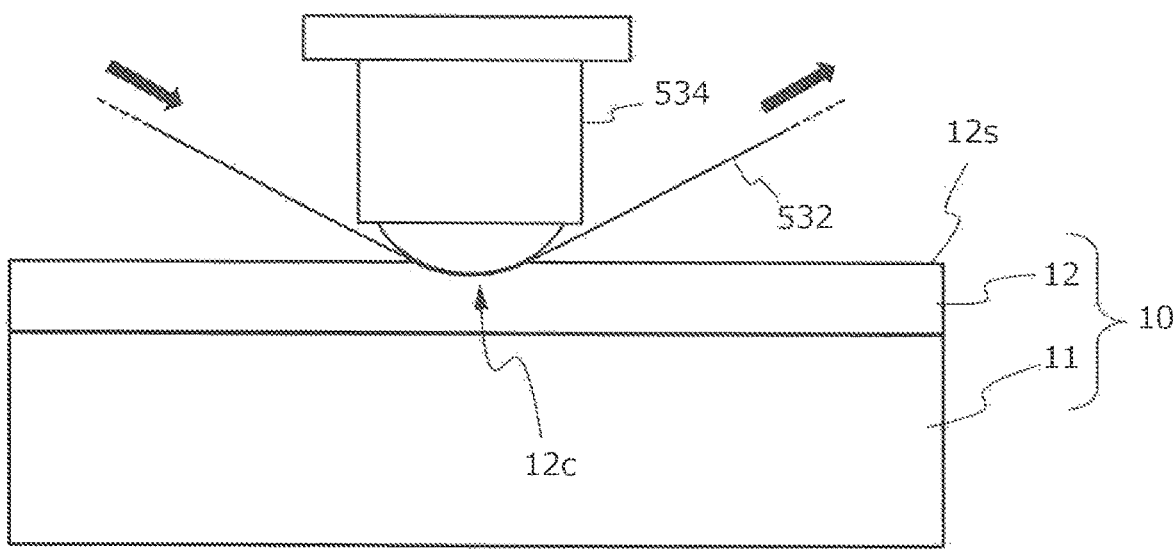
FIG. 2B is a diagram showing a structure at the finish of the step of polishing away a particle by pressing a running polishing tape against the particle.

FIG. 2B is a cross-sectional view schematically showing a structure at the finish of the polishing process on the particle 30. The timing of finishing the polishing process is preferably determined such that the entirety of the particle 30 is removed as shown in FIG. 2B. However, when the polishing process is carried out, it is not efficient to precisely measure the largeness of each particle 30. The particle 30 can be observed by an image sensor before or in the middle of the polishing. However, as for each of a large number of particles 30, it is difficult to thoroughly remove the entirety of the particle without polishing the surface 12s of the plastic film 12. Therefore, usually, when the polishing process on each of the particles 30 is finished, a recessed portion (polish recess) 12c is likely to be formed at a position on the surface 12s of the plastic film 12 at which the particle 30 was present as shown in FIG. 2B. The polish recess 12c is a generally circular excavated concave surface which has, for example, a depth of about 0.1 µm to 1.0 µm and a diameter of about several tens of micrometers to several hundreds of micrometers. The inside of the polish recess 12c can have recessed and raised portions in the form of fine stripes whose width and depth depend on the diameter of the abrasive grains (polishing agent).

Even when the particle 30 is removed using a polishing apparatus, the encapsulation performance (moisture resistance) of the flexible display can deteriorate. One of the causes of this deterioration is the presence of microscopic recessed and raised portions (polish scars) inside or near the polish recess 12c formed by the polishing process. The polish scars can be, typically, a large number of grooves each having a width equivalent to the size of abrasive grains (e.g., equal to or smaller than 0.1 µm to 0.3 µm). Such polish scars can not only include recessed portions in the shape of a simple groove but also have a complicated and minute irregular shape near the edges of the groove-like recessed portions.

Figure 3A:
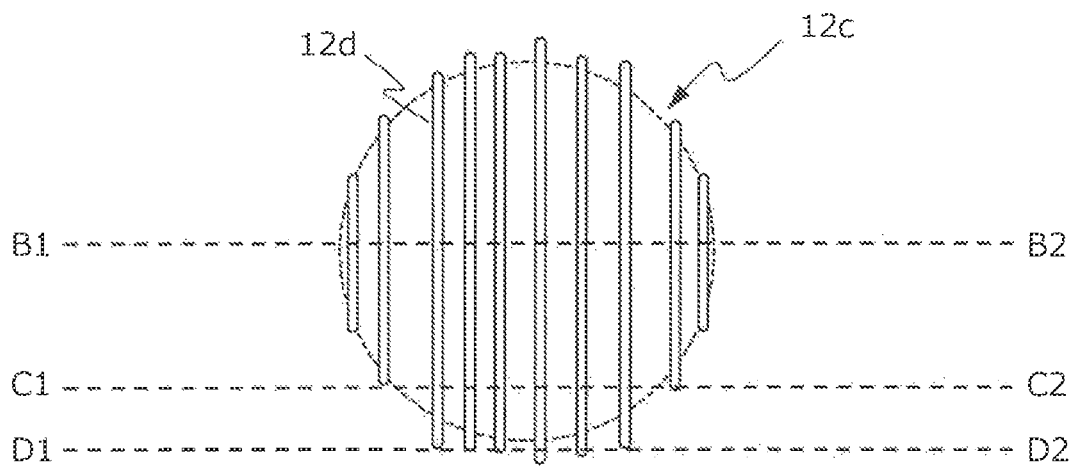
FIG. 3A is a top view schematically showing a polish recess.
Figure 3B:
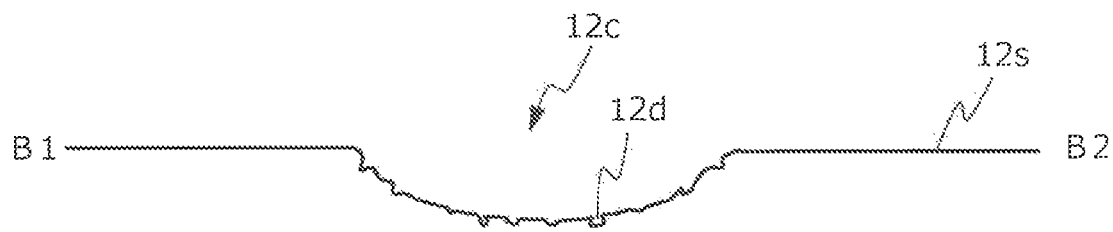
FIG. 3B is a cross-sectional view of the polish recess 12c taken along line B1-B2 of FIG. 3A.
Figure 3C:
FIG. 3C is a cross-sectional view of the polish recess 12c taken along line C1-C2 of FIG. 3A.
Figure 3D:
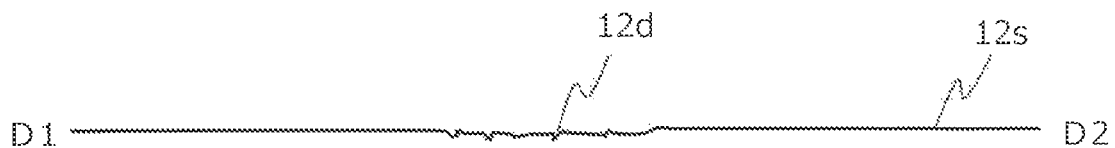
FIG. 3D is a cross-sectional view of the polish recess 12c taken along line D1-D2 of FIG. 3A.

FIG. 3A is a top view of a polish recess 12c. In FIG. 3A, a large number of polish scars 12d formed by polishing are schematically shown in a simplified form. FIG. 3B, FIG. 3C and FIG. 3D are cross-sectional views of the polish recess 12c shown in FIG. 3A taken along line B1-B2, line C1-C2 and line D1-D2, respectively. Minute polish scars 12d are formed in the surface 12a of the plastic film 12. The polish scars 12d can be formed not only inside the polish recess 12c as shown in FIG. 3B and FIG. 3C but also near the perimeter of the polish recess 12c as shown in FIG. 3D. Many of the polish scars 12d are formed so as to extend in the running direction of the polishing tape 532 of FIG. 2B. The solid arrows of FIG. 3A indicate the running direction of the polishing tape 532. Note that the scale of the width and depth of the polish recess 12c and the width and depth of the polish scars 12d shown in the drawings is rather determined from the viewpoint of understandability, and the actual scale is not reflected in the drawings.

Figure 4:
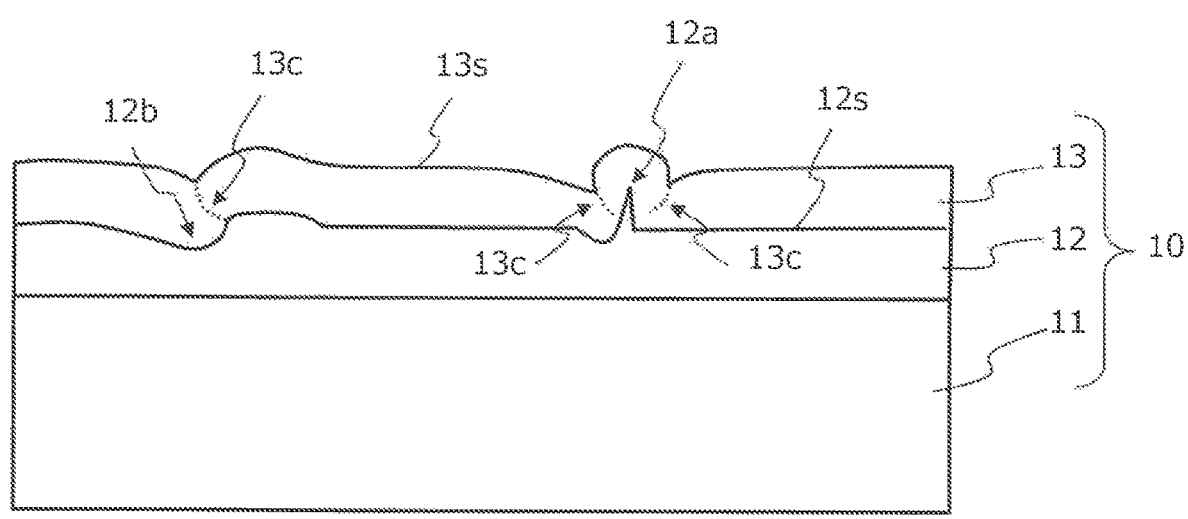
FIG. 4 is a cross-sectional view of a structure in which a gas barrier film is provided on a flexible display supporting substrate of a conventional example.

FIG. 4 is a schematic cross-sectional view enlargedly showing a typical irregular shape in the polish recess 12c of the plastic film 12 in the supporting substrate 10 after the polishing process. In FIG. 4, part of the surface 12s of the plastic film 12 in and near the polish recess 12c has a minute protrusion 12a which has a height of not less than 50 nm and not more than 300 nm and a minute recessed portion 12b which has a depth of not less than 50 nm and not more than 300 nm. The minute recessed and raised portions of such a size can be detected by observing a cross section using an electron microscope. There is a gas barrier film 13 deposited on the plastic film 12.

Although it is known that a large number of polish scars are formed by polishing in the surface 12s of the plastic film 12, it has been believed that if the surface 12s of the plastic film 12 is covered with the gas barrier film 13, the recessed and raised portions in the surface 12s are planarized, and deterioration of the gas barrier film 13 does not particularly occur. When the gas barrier film 13 was formed but the encapsulation performance deteriorated, it was estimated that a pinhole defect in the gas barrier film was a cause of the deterioration of the encapsulation performance. This is because there was an opinion that such a pinhole defect can spontaneously occur during formation of the gas barrier film even if the underlayer is flat.

However, when a gas barrier film 13 is formed on a surface 12s which has a minute protrusion 12a and a minute recessed portion 12b which are still smaller than a size detectable by an optical microscope, there is a probability that a crack 13c will occur in the gas barrier film 13 and deteriorate the encapsulation performance.

As will be described later, according to the embodiment of the present disclosure, after the polishing process is carried out using a polisher head, an adequate treatment is selectively performed on a region in which minute protrusions and recessed portions can be formed by polishing (polish recess 12c) rather than planarizing the entirety of the surface 12s of the plastic film 12 using a film of high step coverage. Further, in the embodiment of the present disclosure, a liquid material which can cover a minute step due to surface tension is supplied into the polish recess and, therefore, planarization at a level which cannot be realized by thin film deposition by chemical vapor deposition (CVD) is possible. More specifically, even if a protrusion 12a which has a height of not less than 50 nm and not more than 300 nm and/or a recessed portion 12b which has a depth of not less than 50 nm and not more than 300 nm is formed in part of the surface 12s of the plastic film 12 inside and near the polish recess 12c, deterioration of the encapsulation performance can be suppressed.

Embodiment

Hereinafter, embodiments of the present disclosure are described. In the following description, unnecessarily detailed description will be omitted. For example, detailed description of well-known matter and repetitive description of substantially identical elements will be omitted. This is for the purpose of avoiding the following description from being unnecessarily redundant and assisting those skilled in the art to easily understand the description. The present inventors provide the attached drawings and the following description for the purpose of assisting those skilled in the art to fully understand the present disclosure. Providing these drawings and description does not intend to limit the subject matter recited in the claims.

A flexible display of an embodiment of the present disclosure includes a flexible substrate and an OLED device supported by the flexible substrate. The flexible substrate includes a plastic film whose surface has a polish recess and an oxide layer overlying a part of the surface of the plastic film and covering at least part of the polish recess. In the present embodiment, the oxide layer that covers at least part of the polish recess is formed by a sol-gel method. The oxide layer selectively covers a region in which polish scars can be present, rather than covering the entire surface of the plastic film with the oxide layer. Therefore, the encapsulation performance can be effectively improved without deteriorating the flexibility and light transmittance of the plastic film.

<Polish Planarization Apparatus>

First, the general configuration of a polish planarization apparatus which can be used in an embodiment of the flexible display production method of the present disclosure is described with reference to FIG. 5A and FIG. 5B. This polish planarization apparatus is one of embodiments of the flexible display production apparatus of the present disclosure.

Figure 5A:
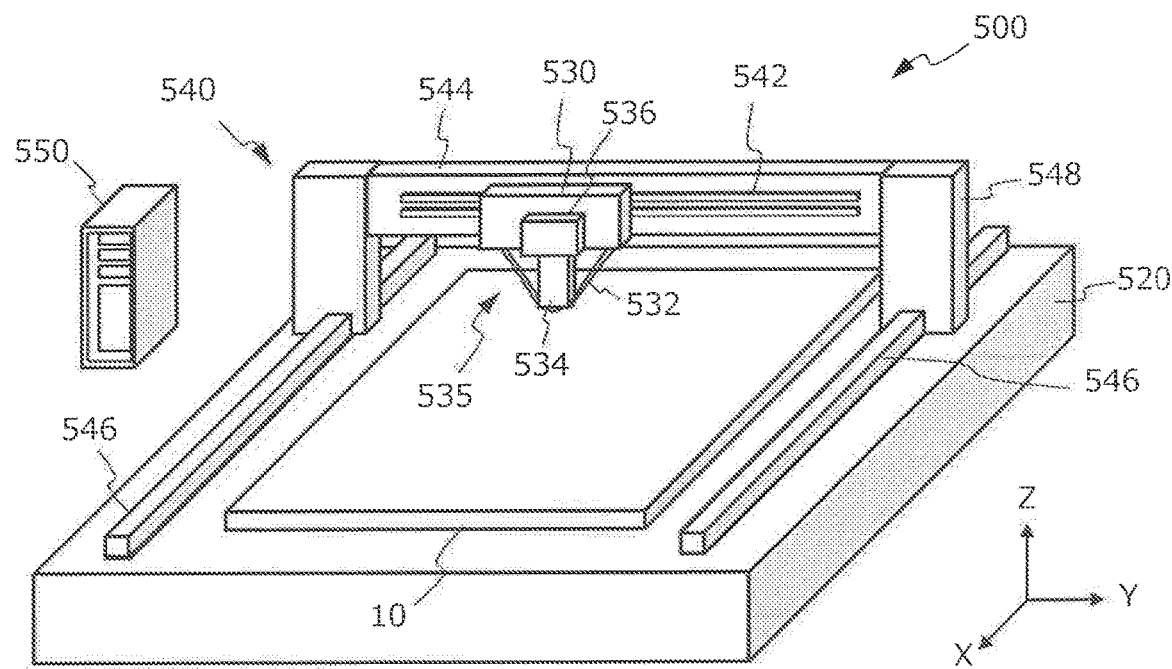
FIG. 5A is a perspective view showing a general configuration of a polish planarization apparatus which can be used in an embodiment of the present disclosure.
Figure 5B:
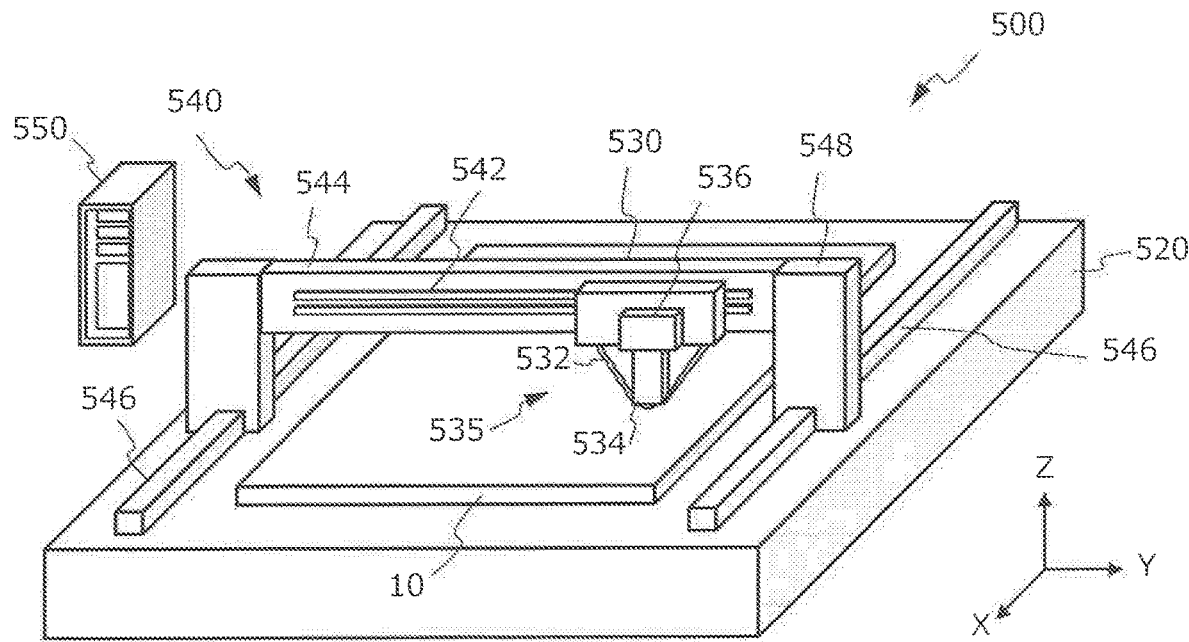
FIG. 5B is another perspective view showing a general configuration of the polish planarization apparatus.

The polish planarization apparatus 500 in an embodiment of the present disclosure includes a stage 520 for supporting the supporting substrate 10 as shown in FIG. 5A and FIG. 5B. The stage 520 is in contact with the glass base 11 of the supporting substrate 10 (see FIG. 1) when the stage 520 supports the supporting substrate 10. The upper surface of the stage 520 is typically flat but may have recessed portions, such as grooves or pores, for vacuum suction. When supported by the stage 520, the supporting substrate 10 is parallel to the XY plane in the example illustrated in the drawings. The XY plane is typically horizontal but may be oriented in an arbitrary direction so long as the stage 520 firmly supports the supporting substrate 10.

The polish planarization apparatus 500 includes a movable unit 530, a positioning unit 540 for changing the position of the movable unit 530 relative to the stage 520, and a control unit 550 for controlling the movable unit 530 and the positioning unit 540.

In the present embodiment, the movable unit 530 includes a polisher head 535. The polisher head 535 includes a motor (not shown) for driving the polishing tape 532 to run and a pressure application unit 534 for pressing the polishing tape 532 against the supporting substrate 10 on the stage 520.

The positioning unit 540 is typically a mechanical driving device which is driven by an actuator such as electric motor. In the example illustrated in the drawings, the positioning unit 540 includes a first support 544 for moving the movable unit 530 in the Y-axis direction along a first guide rail 542 and a second support 548 for moving the first support 544 in the X-axis direction along a second guide rail 546. The positioning unit 540 can move the movable unit 530 that includes the polisher head 535 across a two-dimensional plane (a plane parallel to the XY plane) and, therefore, the polisher head 535 can access (approach) an arbitrary position on the supporting substrate 10.

FIG. 5B is a perspective view schematically showing the polish planarization apparatus 500 in a state different from that shown in FIG. 5A. Comparing the state shown in FIG. 5B with the state shown in FIG. 5A, the movable unit 530 is at different positions.

The control unit 550 is electrically coupled with the movable unit 530 and the positioning unit 540 via wired or wireless means. The control unit 550 typically includes a microcontroller, a memory and a communication interface, which are mutually connected via a communication bus. In the memory, software programs are stored which specify the operations of the microcontroller and the communication interface. The control unit 550 can be a general-purpose computer in which programs for execution of various process operations are installed.

According to the polish planarization apparatus 500 illustrated in FIG. 5A and FIG. 5B, local polishing can be performed on a selected region of the surface of the supporting substrate 10 in which a polish removal object such as detected particle is present, rather than on the entire surface of the supporting substrate 10.

In the present embodiment, the polish planarization apparatus 500 includes a repair head 536. The repair head 536 performs a repair process which will be described later. The repair head 536 can perform a local planarization process (repair) on a polish recess and polish scars. The planarization process on a polish recess and polish scars includes supplying a liquid material to the polish recess and heating this liquid material, thereby forming an oxide layer (sintered layer) from the liquid material.

In the present embodiment, the repair head 536 of the polish planarization apparatus 500 includes a nozzle 537 and a heater 538 shown in FIG. 8 and FIG. 9A, respectively, which will be described later. In the example illustrated in the drawings, the repair head 536 is attached to the movable unit 530 of the polish planarization apparatus 500, although the flexible display production apparatus of the present disclosure is not limited to this example. The polishing apparatus and the planarization apparatus may be configured as different apparatuses such that the movable unit of the polishing apparatus includes a polisher head while the movable unit of the planarization apparatus includes a repair head.

<Flexible Display Production Method>

The flexible display production method of the present disclosure includes, in an embodiment, the step of providing a flexible display supporting substrate which includes a glass base and a plastic film on the glass base, the step of polishing a part of a surface of the plastic film, thereby forming a polish recess in the surface, and the step of forming a sintered layer so as to cover at least part of the polish recess in the surface of the plastic film.

In a preferred embodiment, the step of forming the sintered layer includes supplying a liquid material to the polish recess formed in the surface of the plastic film and heating the liquid material, thereby forming a sintered layer from the liquid material.

The above-described production method can include, after forming the sintered layer, the step of forming a first gas barrier film so as to cover the surface of the plastic film, the step of forming an OLED device supported by a flexible substrate, and the step of forming a second gas barrier film which is supported by the flexible substrate and which covers the OLED device.

<Flexible Display Supporting Substrate>

Figure 6:
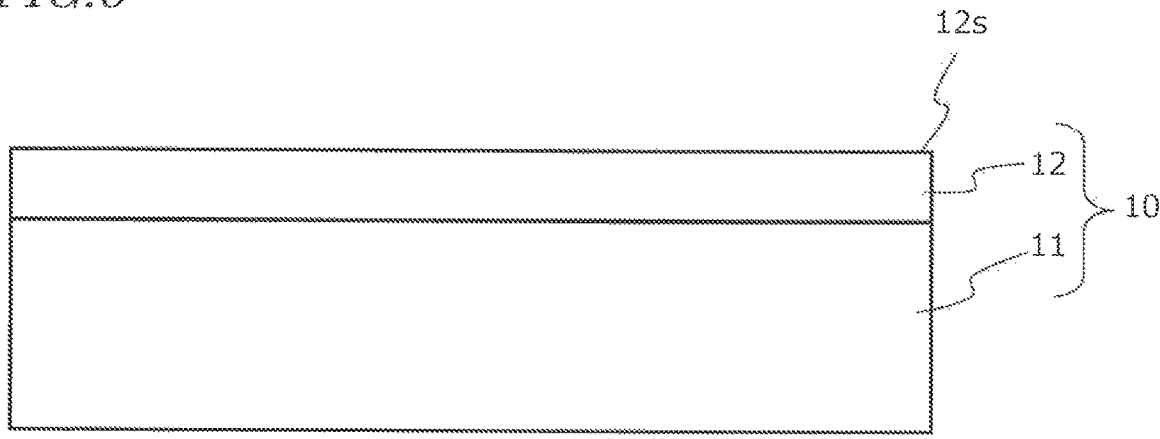
FIG. 6 is a cross-sectional view illustrating a step of a flexible display production method in an embodiment of the present disclosure.

See FIG. 6. FIG. 6 shows a cross section of a part of the flexible display supporting substrate 10 before the polishing process. The supporting substrate 10 includes a glass base 11 and a plastic film 12 provided on the glass base 11. The glass base 11 is a supporting substrate for processes. The thickness of the glass base 11 can be, for example, about 0.3-0.7 mm.

In the present embodiment, the plastic film 12 is a polyimide film having a thickness of, for example, not less than 5 μm and not more than 100 μm. The polyimide film can be formed from a polyamide acid, which is a precursor of polyimide, or a polyimide solution. The polyimide film may be formed by forming a polyamide acid film on the surface of the glass base 11 and then thermally imidizing the polyamide acid film. Alternatively, the polyimide film may be formed by forming, on the surface of the glass base 11, a film from a polyimide solution which is prepared by melting a polyimide or dissolving a polyimide in an organic solvent. The polyimide solution can be obtained by dissolving a known polyimide in an arbitrary organic solvent. The polyimide solution is applied to the surface 12s of the glass base 11 and then dried, whereby a polyimide film can be formed.

In the case of a bottom emission type flexible display, it is preferred that the polyimide film realizes high transmittance over the entire range of visible light. The transparency of the polyimide film can be represented by, for example, the total light transmittance in accordance with JIS K7105-1981. The total light transmittance can be set to not less than 80% or not less than 85%. On the other hand, in the case of a top emission type flexible display, it is not affected by the transmittance.

The plastic film 12 is to be in contact with an alkaline liquid material in subsequent steps. Thus, it is preferred that the plastic film 12 is made of biphenyl type polyimide, which has excellent alkaline resistance. The biphenyl type polyimide has a carbonyl group of an imide bond which is adjacent to a biphenyl structure. This carbonyl group is unlikely to undergo hydrolysis with an alkaline material as compared with a carbonyl group of an imide bond which is adjacent to a monocyclic benzene ring.

The plastic film 12 may be a film which is made of a synthetic resin other than polyimide. Note that, however, in the embodiment of the present disclosure, when the sintered layer is formed by a sol-gel method, a heat treatment at not less than 350° C. is typically performed, and therefore, the plastic film 12 is made of a material which will not be deteriorated by this heat treatment.

The plastic film 12 may be a multilayer structure including a plurality of synthetic resin layers. In the present embodiment, in delaminating a flexible display structure from the glass base 11, laser lift-off is carried out such that the plastic film 12 is irradiated with ultraviolet laser light transmitted through the glass base 11. The plastic film 12 needs to absorb the ultraviolet laser light and decompose (disappear) at the interface with the glass base 11. Alternatively, for example, a sacrificial layer which is to absorb laser light of a certain wavelength band and produce a gas may be provided between the glass base 11 and the plastic film 12. In this case, the plastic film 12 can be delaminated from the glass base 11 by irradiating the sacrificial layer with the laser light.

Next, the polishing process and the planarization process by the polish planarization apparatus 500 which has previously been described with reference to FIG. 5A and FIG. 5B are performed.

<Polishing Process>

When the polishing process by the polish planarization apparatus 500 is performed, the control unit 550 controls the positioning unit 540 such that the polisher head 535 faces an object to be polished (target), such as particle, which is present on the surface 12s of the plastic film 12 included in the supporting substrate 10. Detection of the particle 30 can be realized by, for example, processing an image obtained by an image sensor. The size of the particle 30 can be relatively accurately measured in a direction parallel to the surface 12a of the plastic film 12. Specifically, a particle 30 which is present on the surface 12a of the plastic film 12 of the supporting substrate 10 is detected by an image sensor or the like, and the coordinates of the particle are determined. Assume that n particles to be removed, P1 to Pn, are detected where n is an integer not less than 1. Where k is an integer not less than 1 and not more than n and the coordinates of the planar position of the $k^{th}$ particle Pk is expressed as (xk, yk), the control unit 550 drives the positioning unit 540 to move the movable unit 530 such that the coordinates of the planar position of the lower end of the polisher head 535 accord with (xk, yk).

Then, the polish planarization apparatus 500 lowers the pressure application unit 534 of the polisher head 535 while the polishing tape 532 is kept running. The distance of the lowering is determined such that the polishing tape 532 at the lower end of the pressure application unit 534 reaches the surface of the supporting substrate 10. Although the size of the particle 30 can be relatively accurately measured in a direction parallel to the surface 12s of the plastic film 12, it is difficult to accurately determine the size in a direction perpendicular to the surface 12s, i.e., the height, of the particle 30. Therefore, determination of the polishing amount is desirably carried out with a sufficient margin such that an unpolished portion does not occur. Excessive polishing can lead to formation of a deep recessed portion in the surface 12s of the plastic film 12. For example, in a polishing process which is carried out under such conditions that a particle of, for example, about 3 μm in height can be polished away, the actual height of the particle can sometimes be about 2.5 μm. In such a case, at the position of the polishing process, the surface 12s of the plastic film 12 is abraded by about 0.5 μm and, therefore, a recessed portion of about 0.5 μm in depth can be formed. Further, as previously described, a large number of minute scars (polish scars) can be formed by the polishing agent in and around the polish recess.

Figure 7:
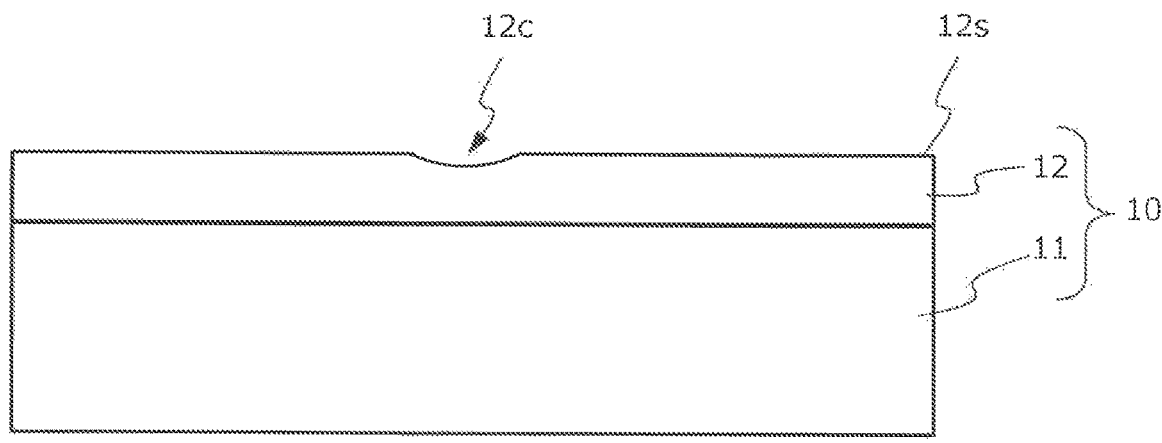
FIG. 7 is a cross-sectional view illustrating a step of the production method in an embodiment of the present disclosure.

As shown in FIG. 7, as a result of the polishing process, a polish recess 12c is formed in the surface 12s of the plastic film 12. Although not shown in FIG. 7, minute protrusions 12a and recessed portions 12b such as illustrated in FIG. 4 can be present in or near the polish recess 12c.

<Planarization Process>

Figure 8:
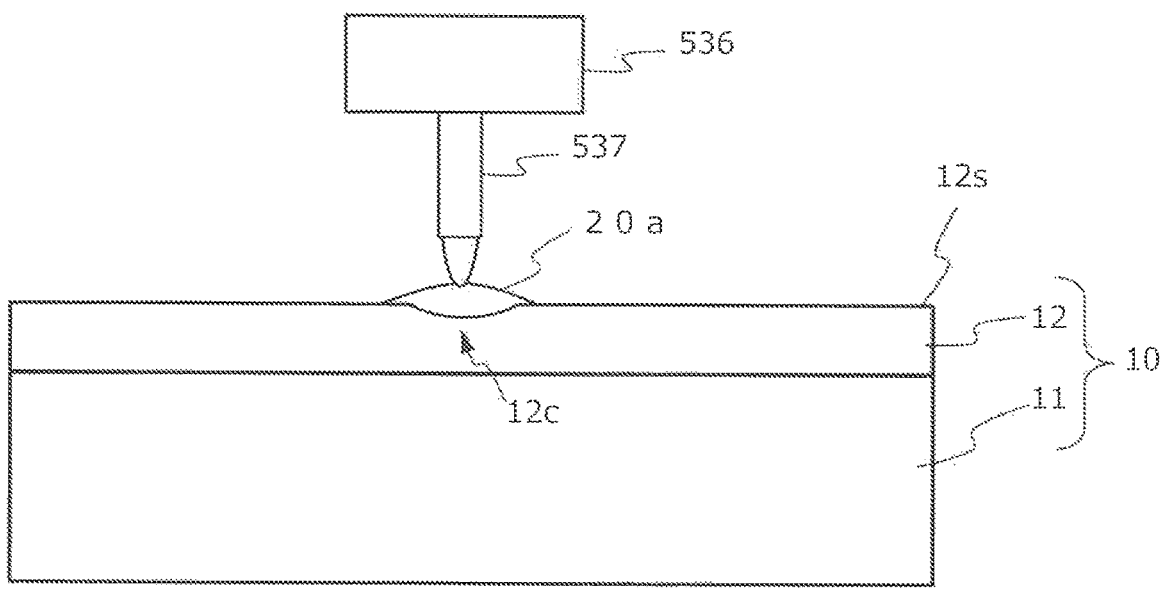
FIG. 8 is a cross-sectional view illustrating a step of the production method in an embodiment of the present disclosure.
Figure 9A:
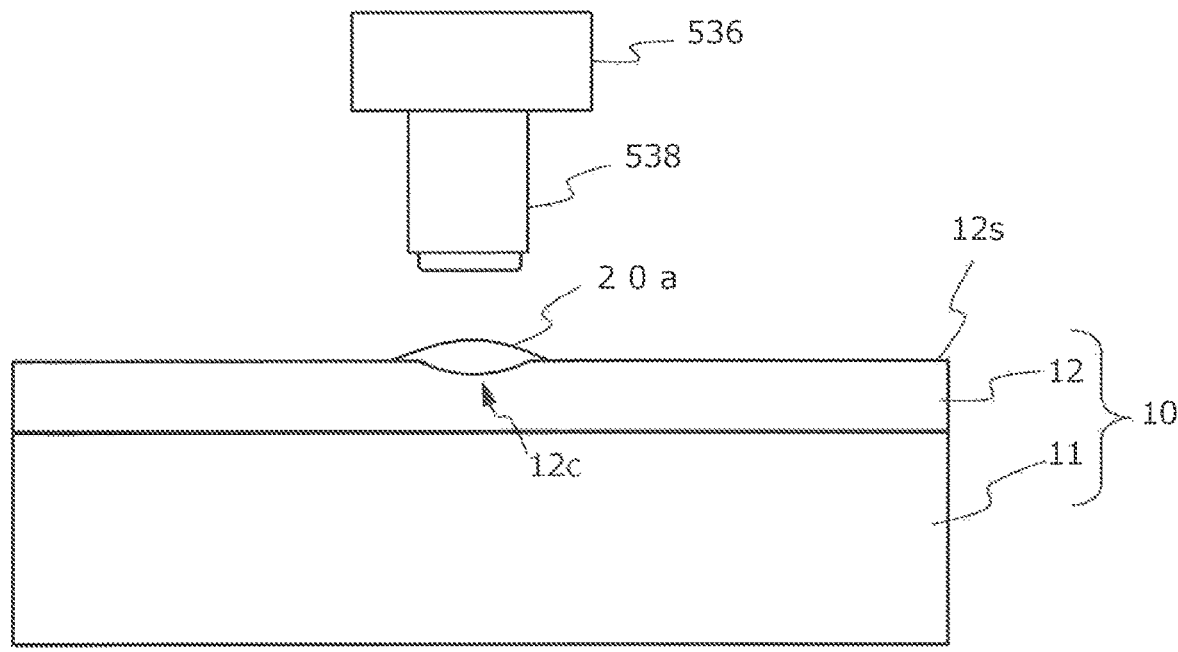
FIG. 9A is a cross-sectional view illustrating a step of the production method in an embodiment of the present disclosure.

Next, as shown in FIG. 8, a liquid material 20a is supplied from the nozzle 537 of the repair head 536 included in the movable unit 530 of the polish planarization apparatus 500 to the polish recess 12c formed in the surface 12s of the plastic film 12 such that the polish recess 12c is filled with a layer of the liquid material 20a. A typical example of the liquid material 20a is a sol which contains an alkoxide. The repair head 536 is capable of ejecting the liquid material 20a from the nozzle 537 according to an ink jet method.

A typical example of the alkoxide is a metal alkoxide. An example of the metal element contained in the metal alkoxide can be a transition metal, a rare earth metal, or a metal element of Group 3 to Group 5 and Group 13 to Group 15. A typical example is one or more metal elements selected from the group consisting of Si, Ti, Ta and Al. Note that, strictly, Si is an element which is a constituent of a semiconductor, although in the present specification Si is included in the metal elements for the sake of convenience.

Examples of the alkoxy group contained in the metal alkoxide include methoxy group, ethoxy group, propoxy group, isopropoxy group, butoxy group, isobutoxy group, pentyloxy group, and hexyloxy group. The metal alkoxide may contain a hydrocarbon group, such as alkyl group, cycloalkyl group, aryl group, and aralkyl group.

The metal alkoxide can be expressed by formula (1):

$$(R1)_n M(OR2)_{X-m} \qquad (1)$$

where R1 is an alkyl group, a cycloalkyl group, an aryl group, or an aralkyl group. R1 may have a substituent. R2 is a lower alkyl group. R1 and R2 may differ depending on m. M is a metal element whose valence is not less than 3. X is the valence of the metal M. m is an integer from 0 to 2 and satisfies the relationship of X−m≥2.

The liquid material 20a may contain metal alkoxides of the same type or different types or may contain other additives.

The liquid material 20a contains an organic solvent as a constituent. Examples of the organic solvent include alcohols, aromatic hydrocarbons, ethers, nitrogen-containing solvents, sulfoxides, and mixture solvents thereof. A solvent-soluble polymer can also be used as the organic solvent.

The liquid material 20a may contain a hardening catalyst. Examples of the hardening catalyst include ternary amines and acid catalysts. The liquid material 20a may contain various additives, such as plasticizer, antioxidant, ultraviolet absorber, flame retardant, antistatic agent, surfactant, filler, colorant, etc.

The liquid material 20a can be prepared by adding a solvent-soluble polymer, a hardening catalyst, an organic solvent, and other constituents to a metal alkoxide or a hydrolyzed metal alkoxide and kneading the resultant mixture. If the metal alkoxide exhibits strong alkalinity, there is a probability that the metal alkoxide will deteriorate the plastic film 12. Thus, when the plastic film 12 is made of a common polyimide, it is preferred that the pH of the liquid material 20a is not more than 10. The pH of the liquid material 20a can be typically set in the range of, for example, not less than 3.5 and not more than 9.0.

The liquid material 20a has fluidity unlike a solid film deposited by physical vapor deposition, such as sputtering, or CVD. The liquid material 20a can spread over the entirety of the polish recess formed in the surface 12s of the plastic film 12 due to surface tension. Thus, the liquid material 20a is excellent in step coverage. Even if a relatively thin film of the liquid material 20a which has a thickness of not more than 300 nm is formed, a surface of high flatness is obtained. The liquid material 20a can tightly adhere to the surface of the protrusion 12a of the plastic film 12 due to surface tension even if the protrusion 12a of the plastic film 12 is minute. Even if the recessed portion 12b of the plastic film 12 is locally deeper, the liquid material 20a reaches the deeper portion and can fill the inside of the recessed portion 12b.

The viscosity of the liquid material 20a can be set in the range of, for example, not less than 25 mPa's and not more than 200 mPa·s. The thickness of the layer of the liquid material 20a covering the polish recess formed in the surface 12s of the plastic film 12 is in the range of, for example, not less than 100 nm and not more than 1000 nm. The thickness of the layer of the liquid material 20a can be controlled by adjusting the amount of the liquid material 20a supplied to the surface 12s of the plastic film 12.

As described above, the liquid material 20a appropriately conceals the polish recess 12c and polish scars, and the surface of the liquid material 20a becomes smooth due to surface tension. The film of the liquid material 20a locally covering part of the surface 12s of the plastic film 12 is heated by the heater 538 of the repair head 536 included in the movable unit 530 of the polish planarization apparatus 500 as shown in FIG. 9A. The volume of the liquid material 20a supplied to a single polish recess 12c is, at most, several hundreds of picoliters (pl) and, therefore, the calories applied by the heater 538 does not reach a level which greatly increases the overall temperature of the supporting substrate 10. The heater 538 may be a light source which emits infrared light. Examples of such a light source include LED (Light Emitting Diode) and semiconductor laser devices.

The irradiation region of the infrared light from the infrared light source has such largeness at the surface s of the plastic film 12 that the irradiation region lies within, for example, a circle of 10 mm in diameter. If the irradiation region of the infrared light has such largeness that the irradiation region covers the extent of the polish recess 12c, the liquid material 20a can be efficiently heated. The extent of the polish recess 12c has such largeness that the polish recess 12c lies within a region of at most several hundreds of micrometers in diameter. For efficiently heating such a narrow region, it is effective to use a laser light source of which the directivity and energy density of infrared light radiation are high. A solid state laser which employs a semiconductor laser as excited light (Diode Pumped Solid State Laser: DPSS laser) can emit infrared light with, for example, the maximum average power of 25 W, the maximum pulse power of 200 mJ, the maximum repetition frequency of 2 kHz, and the pulse width of 40-600 microseconds. A semiconductor laser device itself which can oscillate in the infrared region achieves the power of, for example, 250 mW and, therefore, the semiconductor laser device can be used as a local heater by using an objective lens such that laser light is converged to a size of, for example, several hundreds of micrometers in diameter.

Figure 9B:
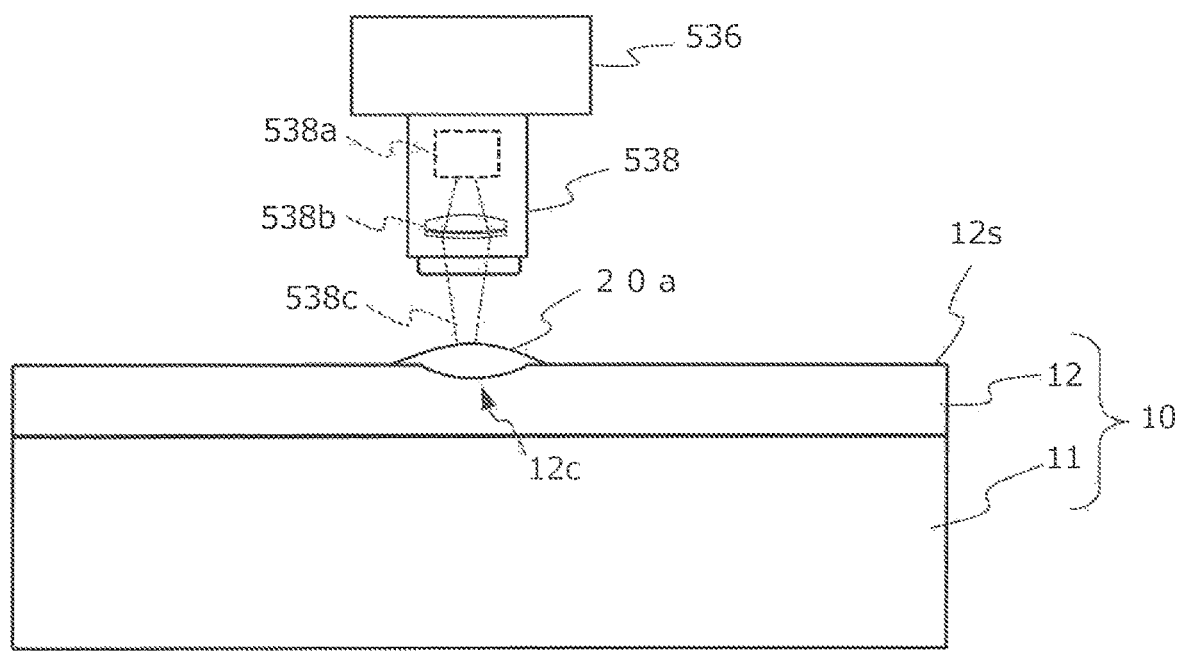
FIG. 9B is a diagram schematically showing a configuration example of a repair head of the polish planarization apparatus in an embodiment of the present disclosure.

FIG. 9B schematically shows a configuration example of the heater 538 of the repair head 536. In the example illustrated in the drawing, the heater 538 includes a semiconductor laser device 538a which functions as an infrared light source and an optical system 538b which includes an objective lens, and is capable of emitting an infrared light beam 538c. The wavelength of the infrared light can be, for example, near infrared at not less than 750 nm and not more than 1.4 µm.

As shown in FIG. 9B, when the semiconductor laser device 538a is used as the infrared light source, the irradiation region of the infrared light can have such largeness at the surface 12s of the plastic film 12 that the irradiation region lies within, for example, a circle of 1 mm in diameter (e.g., not less than 150 µm and not more than 500 µm in diameter). The shape of the infrared irradiation region is arbitrary.

The infrared light irradiation can be carried out in a pulsed or continuous manner. When each polish recess 12c, more correctly the liquid material 20a on the polish recess 12c, is irradiated with infrared light, the position of the heater 538 relative to the flexible display supporting substrate 10 does not need to be fixed. The position of the infrared irradiation region may be shifted stepwise or continuously during irradiation with the infrared light.

When the liquid material 20a on the polish recess 12c is irradiated with infrared light converged in the shape of a beam, the largeness of the beam spot of the infrared light may be smaller than the largeness of the liquid material 20a. Even if part of the liquid material 20a is irradiated with the beam of the infrared light, the heat radially spreads from the irradiation point so that the temperature of the entirety of the liquid material 20a can be increased to 350° C. or higher. The liquid material 20a may be irradiated at different positions with an infrared light beam of a pulsed or continuous wave.

Figure 9C:
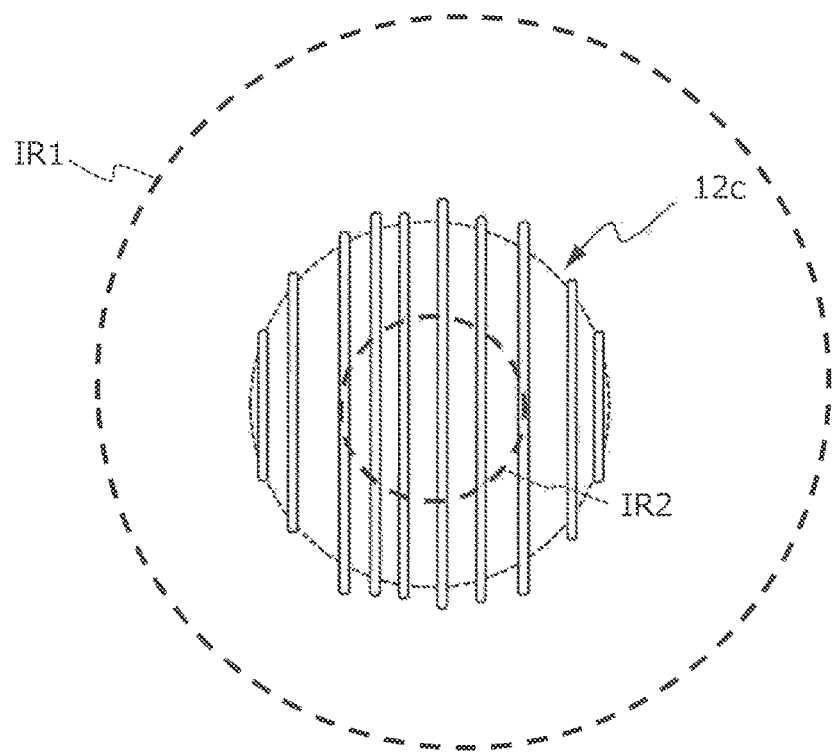
FIG. 9C is a plan view showing an example of the relationship between the polish recess 12c and infrared irradiation regions IR1, IR2.

FIG. 9C is a plan view showing an example of the relationship between the polish recess 12c and infrared irradiation regions IR1, IR2. The infrared irradiation region IR1 covers a range larger than the polish recess 12c. Meanwhile, the infrared irradiation region IR2 is narrower than the polish recess 12c. When the output power of the infrared light source is constant, the irradiation energy density per unit area is inversely proportional to the area of the infrared irradiation region. The irradiation duration of the infrared light can be determined in consideration of the power of the infrared light source used, the area of the infrared irradiation region, and the thermal energy required for sintering of the liquid material 20a.

Although the shape of the infrared irradiation regions IR1, IR2 shown in FIG. 9C is circular, the shape of the infrared irradiation regions is not limited to a circular shape but may be an elliptical or rectangular shape or any other shape. The infrared light emitted from the light source may be branched into a plurality of beams such that the liquid material 20a is concurrently irradiated with the plurality of infrared light beams.

When the infrared light beam 538c emitted from the semiconductor laser device 538a is converged to a small beam spot of several micrometers to several tens of micrometers in diameter, the inside of the infrared irradiation region IR1 of FIG. 9C may be scanned with the beam spot.

Figure 10:
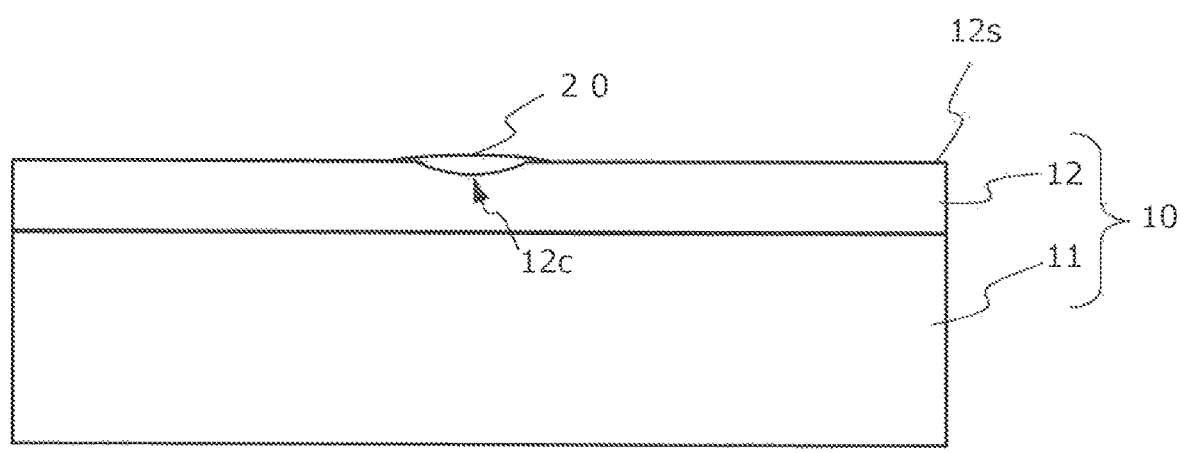
FIG. 10 is a cross-sectional view illustrating a step of the production method in an embodiment of the present disclosure.
Figure 11:
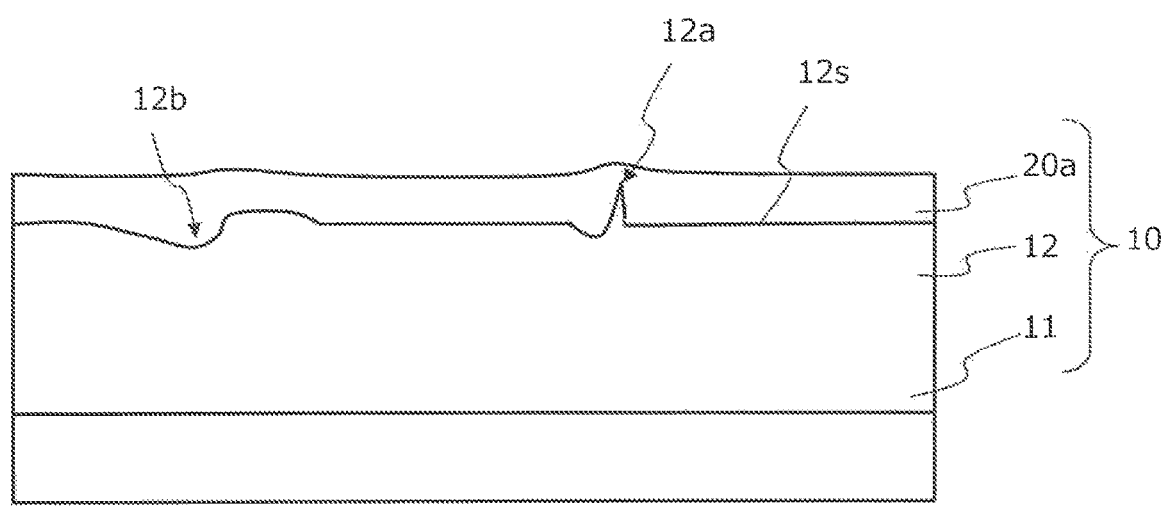
FIG. 11 is a cross-sectional view illustrating a step of the production method in an embodiment of the present disclosure.

By heating the liquid material 20a, a sintered layer 20 can be formed from the liquid material 20a as shown in FIG. 10 via a gel form. At this timing, as shown in FIG. 11, the liquid material 20a can cover a minute protrusion 12a and a minute recessed portion 12b, which are polish scars. According to the embodiment of the present disclosure, a selective planarization process is performed on a region to be polished, rather than the entirety of the surface 12s of the plastic film 12, and accordingly the amount of the required liquid material 20a and the required heating energy can be greatly reduced. This can contribute to maintaining the flexibility and light transmittance of the plastic film 12 at high levels.

In the present embodiment, the step of forming the sintered layer 20 (baking step) is carried out by heating the liquid material 20a to 350° C. or higher. The heating temperature of the liquid material 20a is, for example, not less than 350° C. and not more than 500° C., typically not less than 400° C., or not less than 450° C. This temperature (sintering temperature) can be set to a value close to the highest process temperature in a TFT production process which is performed later.

When the layer of the liquid material 20a changes into the sintered layer 20, the volume of the layer shrinks. It was found that the coverage by the sintered layer 20 over minute recessed and raised portions in the underlayer is scarcely deteriorated even by volume shrinkage in the sintering. When the liquid material 20a is heated by a converged beam of infrared light emitted from a semiconductor laser device as previously described, the temperature can be increased to 350° C. or higher in a short time period of several milliseconds to several seconds. Therefore, growth of crystal grains during the sintering can be suppressed, and a sintered layer 20 which has a smooth surface can be realized. According to the polish planarization apparatus of the present disclosure, heating is locally carried out. Therefore, the sintering temperature of the liquid material 20a may be set to a high temperature, for example, more than 500° C. and not more than 750° C., without being constrained by the thermotolerance of the glass base 11 and the plastic film 12.

According to the present embodiment, even if the polisher head 535 of the polish planarization apparatus 500 polishes the surface 12s of the plastic film 12 so that a polish recess 12c is formed, the repair head 536 supplies the liquid material 20a to the polish recess 12c and heats the liquid material 20a, thereby forming a sintered layer 20. This process can be locally performed on each of a plurality of sites to be planarized in the flexible display supporting substrate 10.

The thickness of the thus-formed sintered layer 20 is, for example, not less than 100 nm and not more than 500 nm. When a particle of greater than 1 μm in diameter is removed by polishing, the thickness of the sintered layer 20 can be set to, for example, 200 nm or smaller. Since the sintered layer 20 has fluidity before cured, the sintered layer 20 has an upper surface flatter than the polish recess 12c in the underlying plastic film 12. Note that, however, in the present embodiment, the sintered layer 20 is not a simple planarization layer but moderates, for example, an abrupt change in the surface shape (polish scar) which is attributed to a minute protrusion 12a or recessed portion 12b such as shown in FIG. 4 and produces the important effect of preventing local performance deterioration of a gas barrier film which is to be formed on the sintered layer 20. This effect is achieved because the liquid material 20a coagulates around a minute protrusion 12a due to surface tension and is likely to remain in a minute recessed portion 12b.

In the present disclosure, the plastic film 12 and the sintered layer 20 overlying the plastic film 12 are generically referred to as "flexible supporting substrate 100". As will be described later, by removing the glass base 11, the flexible supporting substrate 100 functions as a flexible sheet-like substrate for supporting a functional layer and a gas barrier film.

<First Gas Barrier Layer>

Figure 12:
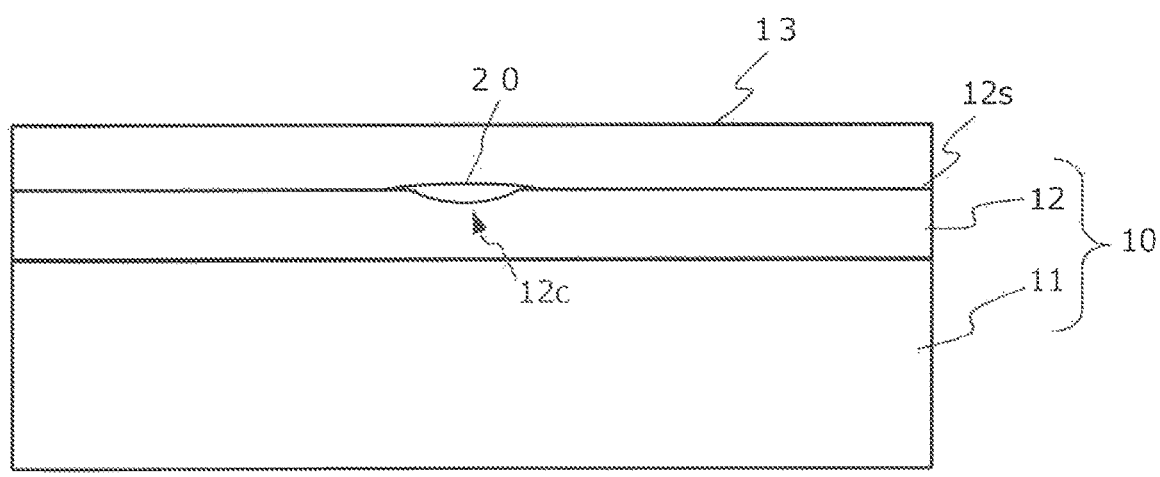
FIG. 12 is a cross-sectional view illustrating a step of the production method in an embodiment of the present disclosure.

Then, as shown in FIG. 12, a first gas barrier film 13 is formed on the plastic film 12 in which the sintered layer 20 has been formed in the polish recess. The first gas barrier film 13 can have various configurations. An example of the first gas barrier film 13 is a film such as silicon oxide film or silicon nitride film. The other example of the first gas barrier film 13 can be a multilayer film including an organic material layer and an inorganic material layer. The lower surface of the first gas barrier film 13 is defined by the upper surface of the sintered layer 20 which has high flatness. Thus, the problem of deterioration of the encapsulation performance of the first gas barrier film 13, which is attributed to a polish recess and polish scars in the surface 12s of the plastic film 12, can be solved.

<Functional Layer>

Hereinafter, the steps of forming a functional layer, which includes TFT and OLED, and a second gas barrier film are described while mainly referring to FIG. 13A through FIG. 13D.

The most characteristic feature in the present embodiment resides in the configurations of the flexible display supporting substrate and the flexible substrate and the production processes of these substrates. The descriptions of the respective processes illustrated in the following paragraphs are merely exemplary and do not limit the embodiments of the present disclosure.

Figure 13A:
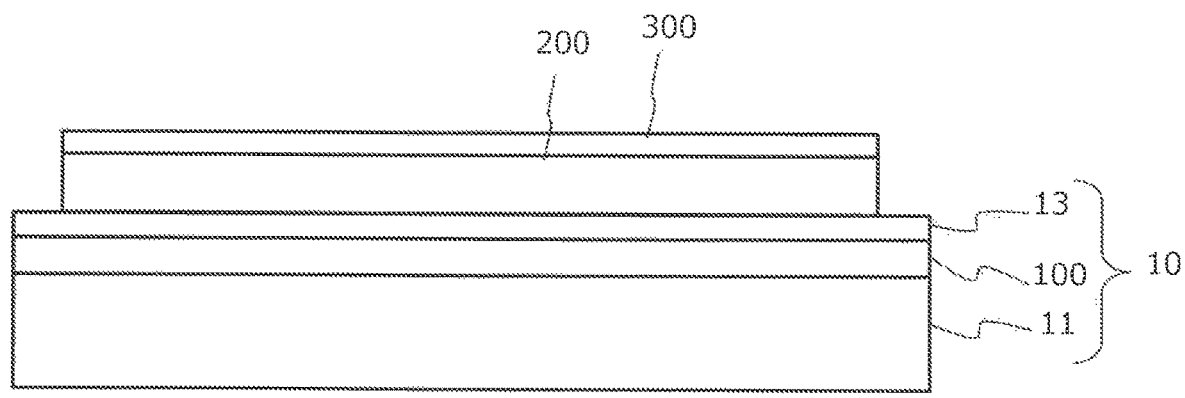
FIG. 13A is a cross-sectional view illustrating a step of the production method in an embodiment of the present disclosure.

First, as shown in FIG. 13A, a TFT layer 200 and an OLED layer 300 are sequentially formed on the flexible display supporting substrate 10 according to a known method. The TFT layer 200 includes a TFT array circuit which realizes an active matrix. The OLED layer 300 includes an array of OLED devices, each of which can be driven independently. The thickness of the TFT layer 200 is, for example, 4 μm. The thickness of the OLED layer 300 is, for example, 1 μm.

Figure 14:
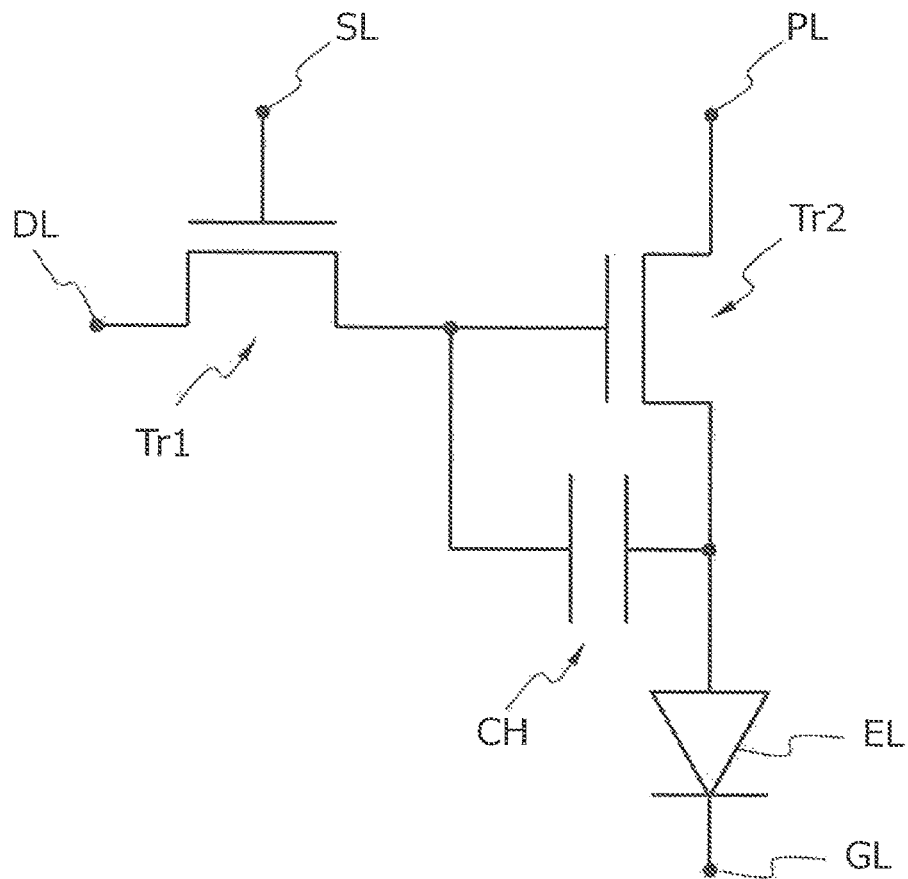
FIG. 14 is an equivalent circuit diagram of a single sub-pixel in a flexible display.

FIG. 14 is a basic equivalent circuit diagram of a sub-pixel in an organic EL (Electro Luminescence) display. A single pixel of the display can consist of sub-pixels of different colors such as, for example, R (red), G (green), and B (blue). The example illustrated in FIG. 14 includes a selection TFT element Tr1, a driving TFT element Tr2, a storage capacitor CH, and an OLED element EL. The selection TFT element Tr1 is connected with a data line DL and a selection line SL. The data line DL is a line for transmitting data signals which define an image to be displayed. The data line DL is electrically coupled with the gate of the driving TFT element Tr2 via the selection TFT element Tr1. The selection line SL is a line for transmitting signals for controlling the ON/OFF state of the selection TFT element Tr1. The driving TFT element Tr2 controls the state of the electrical connection between a power line PL and the OLED element EL. When the driving TFT element Tr2 is ON, an electric current flows from the power line PL to a ground line GL via the OLED element EL. This electric current allows the OLED element. EL to emit light. Even when the selection TFT element Tr1 is OFF, the storage capacitor CH maintains the ON state of the driving TFT element Tr2.

The TFT layer 200 includes a selection TFT element Tr1, a driving TFT element Tr2, a data line DL, and a selection line SL. The OLED layer 300 includes an OLED element EL. Before formation of the OLED layer 300, the upper surface of the TFT layer 200 is planarized by an interlayer insulating film that covers the TFT array and various wires. A structure which supports the OLED layer 300 and which realizes active matrix driving of the OLED layer 300 is referred to as "backplane".

The circuit elements and part of the lines shown in FIG. 14 can be included in any of the TFT layer 200 and the OLED layer 300. The lines shown in FIG. 14 are connected with an unshown driver circuit.

In the embodiment of the present disclosure, the TFT layer 200 and the OLED layer 300 can have various specific configurations. These configurations do not limit the present disclosure. The TFT element included in the TFT layer 200 may have a bottom gate type configuration or may have a top gate type configuration. Emission by the OLED element included in the OLED layer 300 may be of a bottom emission type or may be of a top emission type. The specific configuration of the OLED element is also arbitrary.

The material of a semiconductor layer which is a constituent of the TFT element includes, for example, crystalline silicon, amorphous silicon, and oxide semiconductor. In the embodiment of the present disclosure, part of the process of forming the TFT layer 200 includes a heat treatment step at 350° C. or higher for the purpose of improving the performance of the TFT element. As previously described, in the embodiment of the present disclosure, the sintering temperature during formation of the sintered layer 20 is appropriately adjusted and, therefore, deterioration of the sintered layer 20 is suppressed or prevented in the process of forming the TFT layer 200.

<Second Gas Barrier Layer>

Figure 13B:
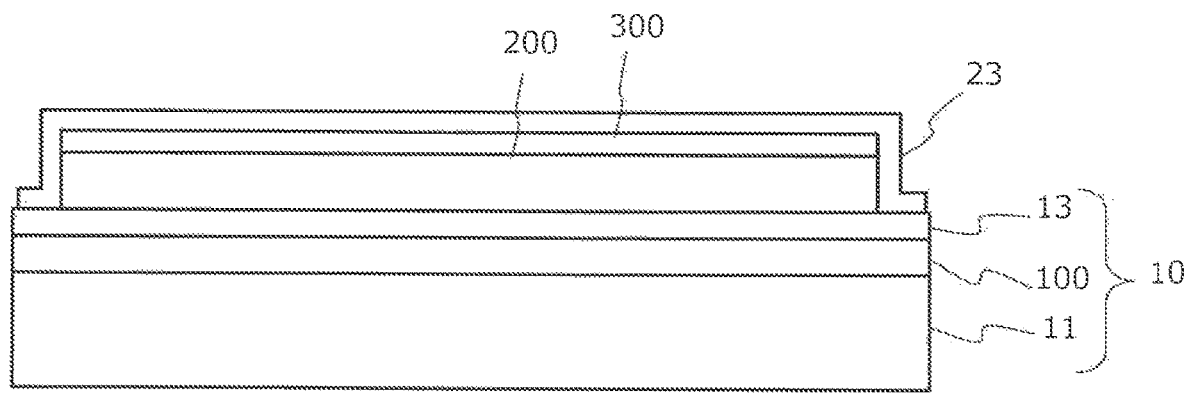
FIG. 13B is a cross-sectional view illustrating a step of the production method in an embodiment of the present disclosure.

After formation of the above-described functional layer, the entirety of the TFT layer 200 and the OLED layer 300 is covered with a second gas barrier film 23 as shown in FIG. 13B. A typical example of the second gas barrier film 23 is a multilayer film including an inorganic material layer and an organic material layer. Elements such as an adhesive film, another functional layer which is a constituent of a touchscreen, polarizers, etc., may be provided between the second gas barrier film 23 and the OLED layer 300. Formation of the second gas barrier film 23 can be realized by a Thin Film Encapsulation (TFE) technique. From the viewpoint of encapsulation reliability, the WVTR (Water Vapor Transmission Rate) of a thin film encapsulation structure is typically required to be not more than $1 \times 10^{-4}$ g/m$^2$/day. According to the embodiment of the present disclosure, this criterion is met. The thickness of the second gas barrier film 23 is, for example, not more than 1.5 μm.

Figure 15:
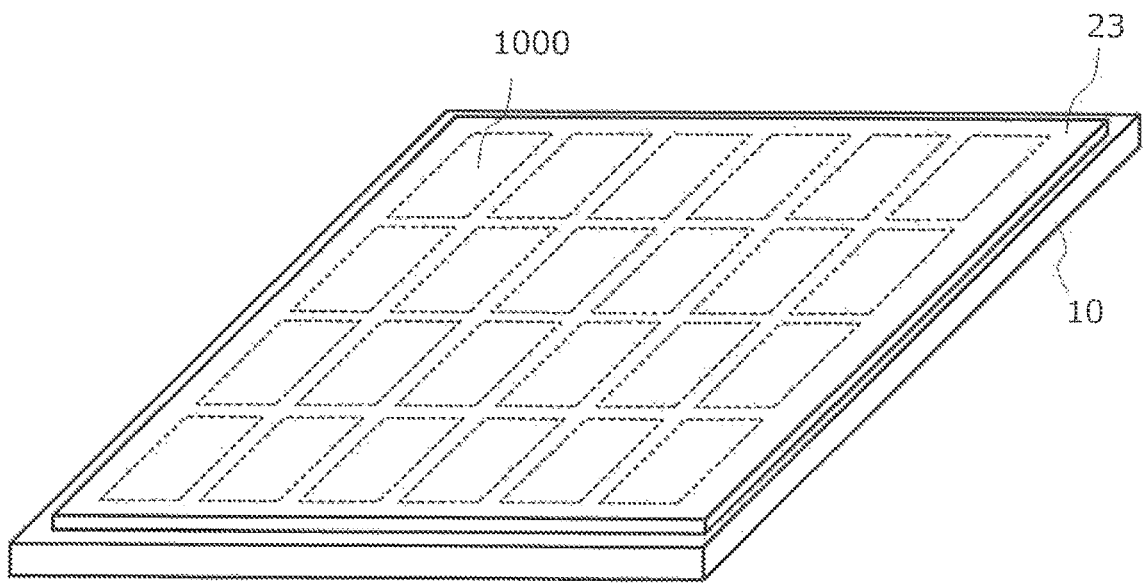
FIG. 15 is a perspective view of a flexible display supporting substrate in the middle of the production process.

FIG. 15 is a perspective view schematically showing the upper surface side of the flexible display supporting substrate 10 at a point in time when the second gas barrier film 23 is formed. A single flexible display supporting substrate 10 supports a plurality of flexible displays 1000.

Figure 13C:
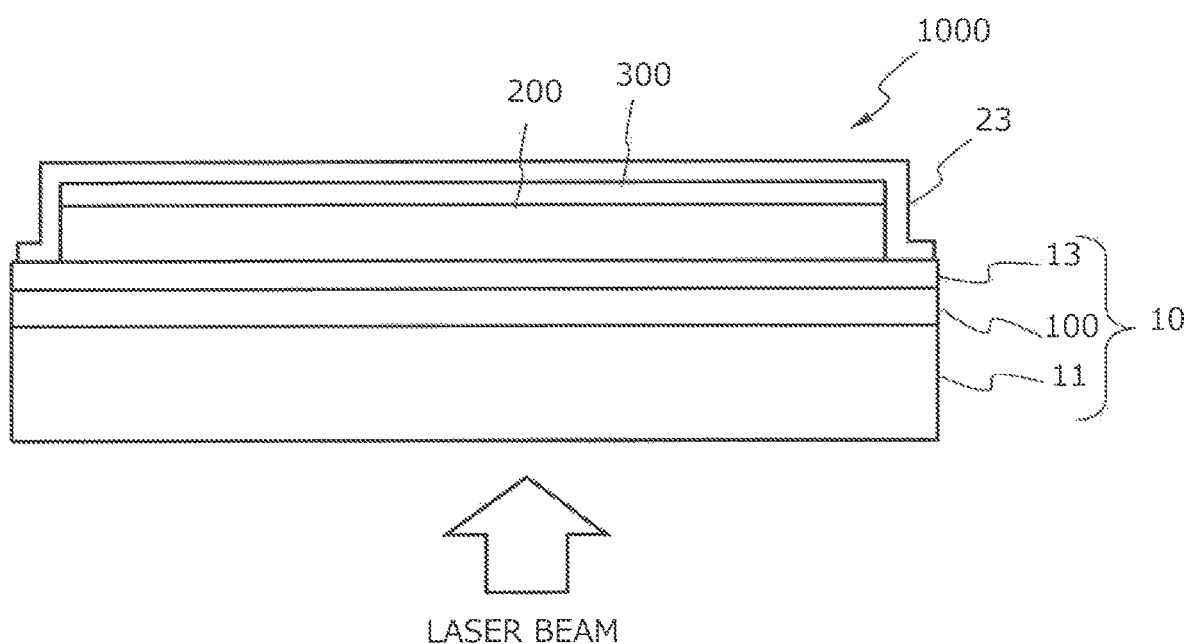
FIG. 13C is a cross-sectional view illustrating a step of the production method in an embodiment of the present disclosure.
Figure 13D:
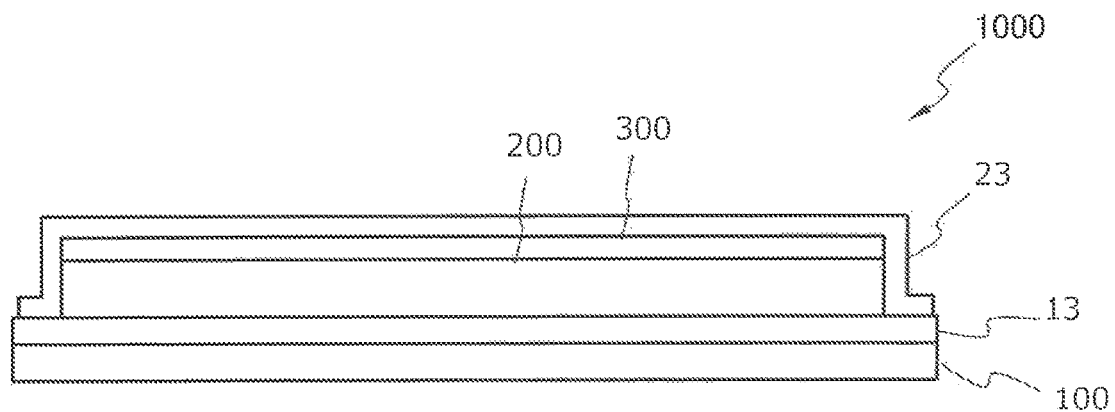
FIG. 13D is a cross-sectional view of a flexible display in an embodiment of the present disclosure.

Then, as shown in FIG. 13C, the flexible supporting substrate 100 is irradiated with a laser beam from the rear surface side of the glass base 11 for lifting off. In this way, the flexible displays 1000 are obtained as shown in FIG. 13D.

According to the embodiment of the present disclosure, the encapsulation performance of the gas barrier film on the flexible substrate side is improved so that performance deterioration of the flexible display which is attributed to entry of water vapor can be suppressed.

INDUSTRIAL APPLICABILITY

An embodiment of the present invention is broadly applicable to smartphones, tablet computers, on-board displays, and small-, medium- and large-sized television sets.

REFERENCE SIGNS LIST

10 . . . flexible display supporting substrate, 11 . . . glass base, 12 . . . plastic film, 12a . . . minute protrusion (polish scar), 12b . . . minute recessed portion (polish scar), 12c . . . polish recess, 12s . . . surface of plastic film, 13 . . . first gas barrier film, 13c . . . crack, 20 . . . sintered layer, 20a . . . liquid material, 23 . . . second gas barrier film, 100 . . . flexible substrate, 200 . . . TFT layer, 300 . . . OLED layer, 1000 . . . flexible display

The invention claimed is:
1. A flexible display production method comprising:
providing a flexible display supporting substrate which includes a glass base and a plastic film on the glass base;
polishing a part of a surface of the plastic film, thereby forming a polish recess in the surface of the plastic film; and
forming a sintered layer so as to locally cover at least part of the polish recess in the surface of the plastic film,
wherein forming the sintered layer includes
supplying a liquid material locally to the polish recess formed in the surface of the plastic film, and forming the sintered layer from the liquid material by irradiating the liquid material with an infrared light beam emitted from an infrared light source to locally heat the liquid material.

2. The method of claim 1, wherein the liquid material is a sol which contains an alkoxide.

3. The method of claim 1, wherein forming the sintered layer includes heating the liquid material to 350° C. or higher.

4. The method of claim 1, comprising
forming a first gas barrier film so as to cover the surface of the plastic film,
forming an OLED device so as to be supported by the flexible substrate, and
forming a second gas barrier film so as to be supported by the flexible substrate and so as to cover the OLED device.

* * * * *